(12) United States Patent
Preisach

(10) Patent No.: US 7,068,199 B2
(45) Date of Patent: Jun. 27, 2006

(54) DIGITAL TO ANALOG CONVERTER, PHASE CONTROL CIRCUIT, TRANSMISSION UNIT RECOGNITION CIRCUIT

(75) Inventor: Helmut Preisach, Besigheim (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/771,466

(22) Filed: Feb. 5, 2004

(65) Prior Publication Data

US 2004/0155805 A1  Aug. 12, 2004

(30) Foreign Application Priority Data

Feb. 5, 2003  (EP) .................................. 03360017

(51) Int. Cl.
*H03M 1/66* (2006.01)

(52) U.S. Cl. ........................ 341/144; 341/141
(58) Field of Classification Search ............... 341/141, 341/144
See application file for complete search history.

(56) References Cited

U.S. PATENT DOCUMENTS

| | | | |
|---|---|---|---|
| 3,877,023 A * | 4/1975 | Spicer et al. | 341/141 |
| 4,591,832 A * | 5/1986 | Fling et al. | 341/141 |
| 4,663,610 A * | 5/1987 | Metz et al. | 341/133 |
| 4,746,903 A | 5/1988 | Czamiak et al. | |
| 4,791,406 A | 12/1988 | Mehrgardt et al. | |
| 6,639,534 B1 * | 10/2003 | Khoini-Poorfard et al. | 341/144 |
| 2002/0014984 A1 | 2/2002 | Matsusaka | |

FOREIGN PATENT DOCUMENTS

| | | |
|---|---|---|
| EP | 0249986 A2 * | 12/1987 |
| EP | 0 720 300 A | 7/1996 |
| GB | 2 176 070 A | 12/1986 |

OTHER PUBLICATIONS

U. Tietze et al, "Halbleiter-Schaltungstechnik" 1989, p. 954.

* cited by examiner

*Primary Examiner*—Howard L. Williams
(74) *Attorney, Agent, or Firm*—Sughrue Mion, PLLC

(57) ABSTRACT

A digital to analog converter is implemented by two or more digital to analog converters and is further implemented in such a way that the operation of its analog output voltages is combined and that its digital input voltages are processed in such a way that, in the case of a continuous incrementing or decrementing of the input values, the individual input values of the two or more digital to analog converters are incremented or decremented in turn. The invention furthermore relates to a phase control circuit in which the digital to analog converter can be used, and also a recognition circuit for recognizing the locking-in of a phase control circuit and a transmission unit in which such assemblies are used.

2 Claims, 4 Drawing Sheets

DIGITAL TO ANALOG CONVERTER, PHASE CONTROL CIRCUIT, TRANSMISSION UNIT RECOGNITION CIRCUIT

BACKGROUND OF THE INVENTION

The invention is based on a priority application EP 03360017.2 which is hereby incorporated by reference.

The invention relates to a digital to analog converter, a phase control circuit comprising a phase detector, a control-circuit filter and a voltage-controlled oscillator, a transmission unit, in particular at the junction between electrical signals and optical signals and a recognition circuit for recognizing the locking-in of a phase control circuit.

The recognition circuit according to the invention has resulted from the original example of the development of a phase control circuit for a transmission unit and is explained below proceeding from the description of said phase control circuit.

In the transmission of data signals in digital form, there are a larger or lesser number of signal distortions. Whenever a noticeable distortion is to be expected, an attempt is made to restore the original signal with the aid of signal regenerators. In the case of digital signals, this is simpler than in the case of analog signals insofar as here only a few, in the case of binary data only two, signal states can occur at all. In addition, transitions between two signal states are permissible only at very definite time instants and, consequently, only to be expected in the vicinity of said time instants. It is then important in this connection that the greatest probability of finding the correct signal state exists in the center between two time instants. The distance between two such time instants is the clock pulse that underlies the transmission.

If it is desired to view a still unregenerate signal on an oscillograph or to examine a corresponding printout of a simulation, the time base (x-axis) is expediently chosen in such a way that the signal (y-axis) starts again from the beginning after one or more whole clock pulses. The display then has the appearance of an eye or eyes lying immediately alongside one another. Mention is therefore often made of an "eye diagram", an "eye", the "eye opening" or the like. These expressions are also used even if the continuous signal trace itself is examined.

Such a signal is therefore regenerated in such a way that the actual signal value is always determined in the center of the eye, where the eye opening is greatest and the next permissible data value is outputted.

For this purpose, phase control circuits of the type mentioned at the outset are standard. In the case underlying the invention, dynamic fluctuations are due to the fact that the input signal originates from data packets that do not follow one another with exactly the same intervals. Long-term changes are due to the variation in operating parameters that may also originate from ageing of the affected parts. The compensation for the long-term changes causes phase fluctuations, a so-called "dithering". Said dithering can be minimized if the control-circuit filter has as low an upper cutoff frequency as possible.

For the sake of completeness, it should be pointed out here that such a phase control circuit also adjusts the frequency. A clock pulse that is adjusted in such a way that the phase is correct at all the consecutive points of the some phase also has the correct frequency.

In the original example, the working range of the phase control circuit is, in addition, very large in comparison to the center frequency. Here, it is no longer possible to employ only one oscillator; on the contrary, a plurality, in the original example three, oscillators are provided, of which the most suitable is used in each case. The latter must then be driven in its entire working range as precisely as possible with a suitable control voltage. Furthermore, it is necessary to determine whether the phase control circuit has locked in or not.

SUMMARY OF THE INVENTION

The object of the invention is to provide a digital to analog converter having high resolution. It should b usable in a phase control circuit for a transmission unit that is to operate in a large working-frequency range and can therefore also have a recognition circuit for recognizing the locking-in.

According to the invention, this object is achieved by a digital to analog converter, wherein the digital to analog converter is implemented by two or more digital to analog converters, in that it is furthermore implemented in such a way that the operation of its analog output voltages is combined and in that its digital input values are processed in such a way that, in the case of a continuous incrementing or decrementing of said input values, the individual input values of the two or more digital to analog converters are incremented or decremented in turn.

This object is further achieved by a phase control circuit, comprising a phase detector, a control-circuit filter and a voltage-controlled oscillator, in which the phase detector is constructed in such a way that it compares the phase of the output signal of the voltage-controlled oscillator with the phase of an input signal and delivers an error signal that corresponds to the difference between the two phases, and in which the control-circuit filter is constructed in such a way that it converts the error signal into a control signal for the voltage-controlled oscillator in such a way that the latter is able to follow both the dynamic fluctuations of the phase of the input signal and also long-term variations in this phase, wherein the control-circuit filter comprises two parallel branches of which a first branch is dimensioned with regard to the dynamic fluctuations and a second branch is dimensioned with regard to the long-term variations.

This object is further achieved by a transmission unit, in particular signal regenerator at the junction between electrical signals and optical signals, having an input circuit for largely restoring a signal trace unaffected by transmission interferences, wherein the input circuit has a phase control circuit, comprising a phase detector, a control-circuit filter and a voltage-controlled oscillator, in which the phase detector is constructed in such a way that it compares the phase of the output signal of the voltage-controlled oscillator with the phase of an input signal and delivers an error signal that corresponds to the difference between the two phases, and in which the control-circuit filter is constructed in such a way that it converts the error signal into a control signal for the voltage-controlled oscillator in such a way that the latter is able to follow both the dynamic fluctuations of the phase of the input signal and also long-term variations in this phase, wherein the control-circuit filter comprises two parallel branches of which a first branch is dimensioned with regard to the dynamic fluctuations and a second branch is dimensioned with regard to the long-term variations, wherein the first branch is constructed in analog circuit engineering and the second branch is constructed in digital circuit engineering, wherein the second branch has a window comparator, a counter and a digital to analog converter, wherein the inputs of the digital to analog converter are connected to the outputs of the highest-value stages of the counter, wherein the digital to analog converter is implemented by two or more digital to analog converters, in that it is furthermore implemented in such a way that the operation of its analog output voltages is combined and in that its digital input values are processed in such a way that, in the case of a continuous incrementing or decrementing of said input values, the individual input values of the two or more digital to analog converters are incremented or decremented in turn.

This object is further achieved by a recognition circuit for recognizing the locking-in of a phase control circuit comprising a phase detector, a control-circuit filter and a voltage-controlled oscillator, in particular a phase control circuit, comprising a phase detector, a control-circuit filter and a voltage-controlled oscillator, in which the phase detector is constructed in such a way that it compares the phase of the output signal of the voltage-controlled oscillator with the phase of an input signal and delivers an error signal that corresponds to the difference between the two phases, and in which the control-circuit filter is constructed in such a way that it converts the error signal into a control signal for the voltage-controlled oscillator in such a way that the latter is able to follow both the dynamic fluctuations of the phase of the input signal and also long-term variations in this phase, wherein the control-circuit filter comprises two parallel branches of which a first branch is dimensioned with regard to the dynamic fluctuations and a second branch is dimensioned with regard to the long-term variations, wherein the first branch is constructed in analog circuit engineering and the second branch is constructed in digital circuit engineering, wherein the second branch has a window comparator, a counter and a digital to analog converter, wherein the inputs of the digital to analog converter are connected to the outputs of the highest-value stages of the counter, wherein the digital to analog converter is implemented by two or more digital to analog converters, in that it is furthermore implemented in such a way that the operation of its analog output voltages is combined and in that its digital input values are processed in such a way that, in the case of a continuous incrementing or decrementing of said input values, the individual input values of the two or more digital to analog converters are incremented or decremented in turn, wherein the recognition circuit is constructed in such a way that it is capable of impressing an interference variable on the phase control circuit, in that it is furthermore constructed in such a way that it is capable of recognizing a change in the output frequency of the voltage-controlled oscillator, and in that it is furthermore constructed in such a way that it is capable of delivering an alarm signal if impressing an interference variable results in a change in the output frequency that is further constructed in such a way that the change in the output frequency of the voltage-controlled oscillator is recognized by means of a frequency counter.

The digital to analog converter according to the invention is implemented by a type of parallel circuit of two or more digital to analog converters with correspondingly low resolution. Their output voltages are added together, at least from the point of view of their action. Its digital input value is processed in such a way (245) that, in the case of a continuous incrementing or decrementing of said input values, the individual input values of the two or more digital to analog converters (241, . . . , 244) are incremented or decremented in turn.

Further configurations of the invention are to be found in the subclaims and in the description below.

BRIEF DESCRIPTION OF THE DRAWINGS

Proceeding from the description of the phase control circuit according to the invention, the invention is further explained below with the aid of the accompanying drawings.

DETAILED DESCRIPTION OF THE DRAWINGS

Figure 1:
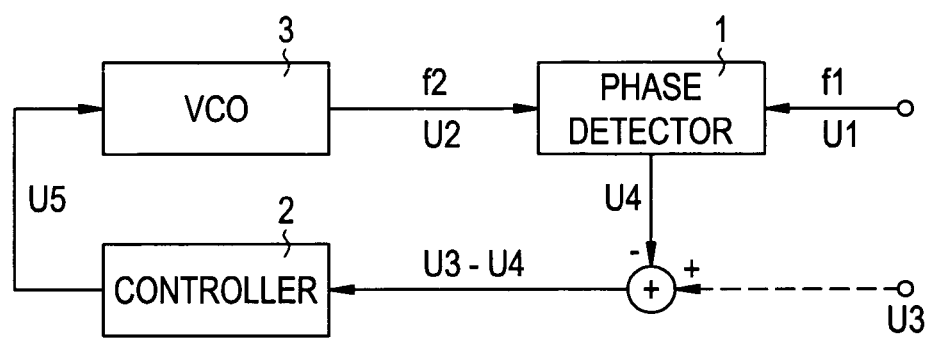
FIG. 1 shows the basic, generally known, structure of a phase control circuit.

The basic, generally known, structure of a phase control circuit is described first using FIG. 1. FIG. 1 is based on the diagram 27.20 of the standard work entitled "Halbleiter-Schaltungstechnik" by U. Tietze and Ch. Schenk, Ninth Edition, Springer-Verlag, Berlin, Heidelberg, New York, London, Paris, Tokyo, 1989.

FIG. 1 shows a phase detector 1, a control circuit filter 2, designated there as controller, and a voltage-controlled oscillator 3, designated there as tracking oscillator.

The phase detector 1 compares an input signal U1, designated there as reference frequency f1, in regard to the phase with the output signal U2 of the voltage-controlled oscillator 3, also designated there by f2. Its output signal U4, designated there as controlled variable, is negated and fed to the input of the control-circuit filter 2. Optionally, a voltage U3, designated there as reference variable, can also be added to said output signal U4, as a result of which a variable U3–U4, designated there as system deviation, is present at the input of the control-circuit filter 2. The output voltage U5 is fed to the input of the voltage-controlled oscillator 3, designated there as manipulated variable. In this diagram, the phase control circuit does not have an output. Needed as output variable of a phase control circuit is the output signal U2 of the voltage-controlled oscillator 3. In this respect, the entire phase control circuit has a flywheel effect in the comparison between the clock pulse of the input signal U1 with the clock pulse of the output signal U2. Such phase control circuits are therefore occasionally designated as a flywheel circuit.

Such a phase control circuit now operates in such a way that, if no voltage U3 is present, the voltage-controlled oscillator 3 delivers an output signal U2 whose frequency f2 is either equal to the reference frequency f1 or a harmonic frequency thereto (n×f1=m×f2), the phase control circuit then being locked in, or the frequency f2 corresponds to one of the band edges of the oscillator 3, the phase control circuit then not being locked in. Since the band edges of the oscillator 3 are not absolute fixed points, the frequency is then also not very stable.

Figure 2:
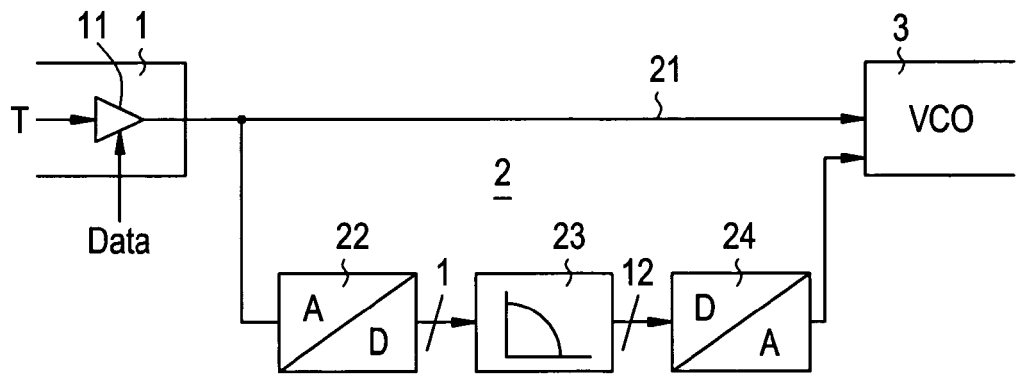
FIG. 2 shows a portion of the phase control circuit according to FIG. 1 that has been modified here in accordance with the invention.

In accordance with FIG. 2, the control-circuit filter 2 is therefore divided into two parallel branches, of which the first branch, the upper one in the figure, is designed in regard to the dynamic fluctuations, while the second branch, the lower one in the figure, is dimensioned in regard to the long-term variations. The first branch delivers, in this case, the output signal of the phase detector 1 directly to an input of the oscillator 3, while the second branch contains a low-pass filter 23.

In particular cases, it may be expedient, as in the case of other control circuits, to respond to rapid input fluctuations also rapidly. This may be the case, for example, if two rather long data packets follow one another at any random interval. In this case, it may be appropriate, as is also otherwise known from control engineering, to add a differential component. The flywheel effect then, of course, only lasts until the next abrupt change.

In the example shown, the first branch is constructed in analog circuit engineering. In this branch, only the output circuit 11 of the phase detector 1 is actually operative. The output circuit 11 of the phase detector 1 is in this case a combination of phase detector and amplifier. In the case underlying the invention, the gain factor can be switched between 0 dB and 14 dB. Consequently, the sensitivity of the phase control circuit can be adjusted with respect to the dynamic fluctuations. The second branch is constructed here in digital circuit engineering and therefore contains, in addition to the low-pass filter 23 constructed digitally also an analog to digital converter 22 and a digital to analog converter 24. The output circuit 11 of the phase detector 1 formally belongs at the same time also to the second branch. In the example, the digital to analog converter 24 has a 24-bit input.

The output circuit 11 of the phase detector 1 is a sample-and-hold circuit that also amplifies at the same time. In the latter, the clock pulse T obtained in the phase control circuit is sampled in a way approximately deformed to a sine with the data clock pulse D of the incoming data stream. In the present original example, which operates at about 10 GHz, no particular measures are necessary to distort the clock pulse sinusoidally. Using the data clock pulse as sampling clock pulse, the result is achieved at the same time that only those time instants enter into the control at which data edges actually occur.

Used as clock pulse for the digital branch in the original example is the system clock pulse of that system which incorporates the phase control circuit.

In the specific original example, the phase control circuit is part of a transmission unit, specifically of a signal regenerator at the junction between electrical signals and optical signals. Such signal regenerators serve to restore a signal trace unaffected by transmission disturbances ultimately, that is to say, to restore the transmission disturbances.

Figure 3:
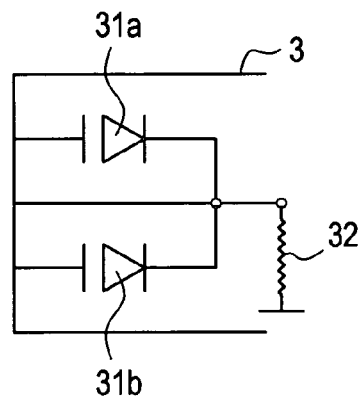
FIG. 3 shows a detail of the phase control circuit according to FIG. 2.

FIG. 3 shows the frequency-determining parts of the oscillator 3, which shows how, in the example, the summation of the two components of the "manipulated variable" U5 takes place. Two varicap diodes 31a and 31b and an inductance 32 are shown.

The two cathodes of the varicap diodes 31a and 31b are each connected to one of the input signals and the anodes are connected together and to the one ("hot") end of the inductance 32. In terms of high frequency, the two varicap diodes 31a and 31b are in parallel with one another and with the inductance 32 and thus form a parallel oscillatory circuit.

The reverse capacitances of the two varicap diod s 31a and 31b operated in the reverse direction can be finely controlled by the applied input voltages, which act as a reverse voltage.

Figure 4:
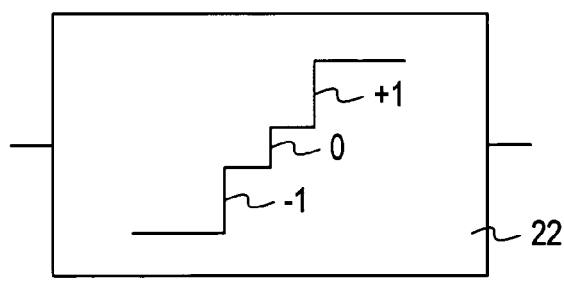
FIG. 4 is a diagram for understanding the operation of the analog-to-digital converter of the phase control circuit according to FIG. 2.

FIG. 4 shows the mode of operation of the analog-to-digital converter 22, which acts here as a window comparator which provides a high or low signal when the input lies outside of the window. The structure of a window comparator with a given characteristic is familiar to the person skilled in the art. The mode of operation is such that a "0" is emitted if the input voltage lies in a narrow range around the setpoint value. If it lies above, a "1" is emitted while if it lies below a "−1" is emitted.

The digital to analog converter 22 constructed as a simple window comparator already has a low-pass action since it does not pass on even severe variations more severely than weak ones.

Figure 5:
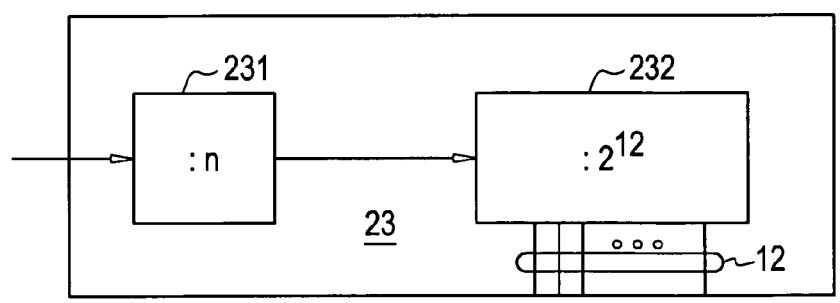
FIG. 5 shows a detail configured according to the invention of the phase control circuit according to FIG. 2.

In addition, the low-pass filter 23 is constructed as a counter, as FIG. 5 shows. In the example, said counter is implemented by two consecutive sub-counters 231 and 232. The first sub-counter 231 divides by a factor n, whereas the second sub-counter 232 divides by an exponent of 2, in this case 2 to the power 12. Its output signal is a twelve-value binary number that then serves as input signal of the subsequent digital to analog converter 24. The total division factor of the two sub-counters determines how rapidly and how precisely the output signal of the window comparator is passed on. In particular, the delay and, consequently, the upper cutoff frequency of the low-pass filter can be considerably affected by the division factor n of the first sub-counter 231.

Figure 6:
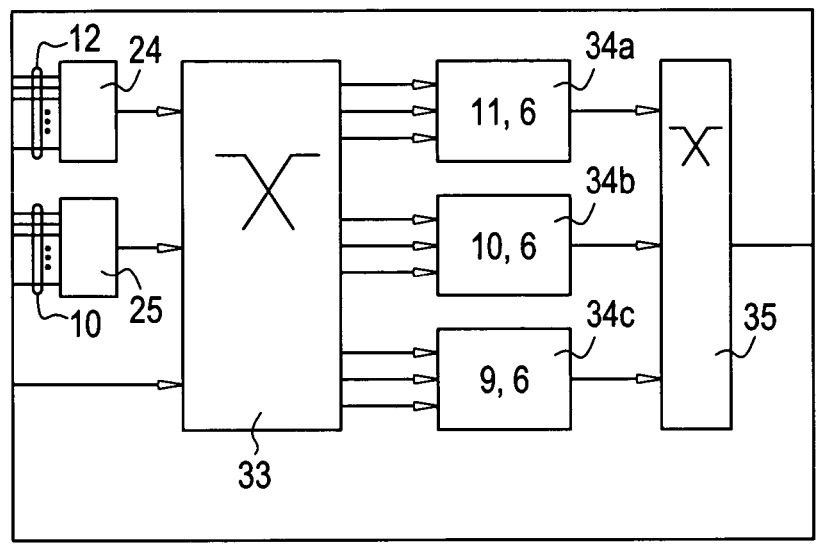
FIG. 6 shows further configurations of the phase control circuit according to FIG. 2.

The structure of the voltage-controlled oscillator 3 and its interaction with the digital to analog converter 24 is explained in greater detail using FIG. 6.

FIG. 6 shows the digital to analog converter 24, a further digital to analog converter 25, an analog switching matrix 33, three oscillators 34a, 34b and 34c and a further analog switching matrix 35.

The outputs of the digital to analog converter 24 and of the further digital to analog converter 25 feed to inputs of the switching matrix 33. A signal line of the first branch of the control-circuit filter 2 and, consequently, of its amplifier 21 likewise feeds to an input of the switching matrix 33. Three outputs of the switching matrix 33 feed in each case respectively to inputs of the oscillators 34a, 34b and 34c. Their outputs feed to one input in each case of the further analog switching matrix 35.

In the embodiment underlying the invention, every frequency in the range from 9.9 GHz to 12.5 GHz is intended to be usable as working frequency. A range of 8 MHz is provided as lock-in range. The bandwidth of the range to be covered is very large compared to the center frequency. Three oscillators are therefore provided here. They are set to center frequencies of 9.6 GHz, 10.6 GHz and 11.6 GHz by manufacturing procedures. Values differing slightly therefrom result from fluctuations in manufacture. However, it is ensured that, despite the manufacturing fluctuations, they overlap by more than the lock-in range.

The three input signals of the input of the switching matrix 33 can therefore optionally be switched through to one of the three oscillators 34a, 34b and 34c in analog form. The switching points within the switching matrix 33 are preferably so-called transfer gates. The output of the selected oscillator 34a, 34b or 34c is switched through in analog form to the subsequent phase detector via the further analog switching matrix 35. Here, too, transfer gates are preferably used again. The respective unused switching points and oscillators are switched off in order to save energy and to avoid local overheating. For this purpose, the respective power source can simply be switched off in many stages.

Just like the precise dimensioning in the individual case, the circuit-engineering provision of the said switching matrices and oscillators can readily be performed by the person skilled in the art on the basis of his expert knowledge.

Phase control circuits are normally used in those application cases in which the working range is small compared to the center frequency. In that case, whether the oscillator can capture and lock in the entire range is then checked from the outset. This is not the case here. The entire range is therefore first divided up as described into a plurality of oscillators, in this case three. In this case, selection necessarily has to be made that must also be checkable. According to the invention, the checking takes place by testing whether the phase control circuit has locked in and does not, for example, accidentally have approximately the correct output frequency.

The recognition circuit used for this purpose according to the invention is therefore constructed in such a way that it is capable of impressing an interference variable on the phase control circuit and, furthermore, in such a way that it is capable of recognizing a change in the output frequency of the voltage-controlled oscillator. Furthermore, said recognition circuit is constructed, according to the invention, in such a way that it is capable of delivering an alarm signal if impressing an interference variable results in a change in the output frequency.

This is based on the consideration that the phase control circuit will correct the interference variable if it is locked in, but not otherwise.

Preferably, said recognition circuit is constructed in such a way that it can use a frequency counter specifically provided for this purpose or for other purposes in order to recognize the locking-in.

Figure 7:
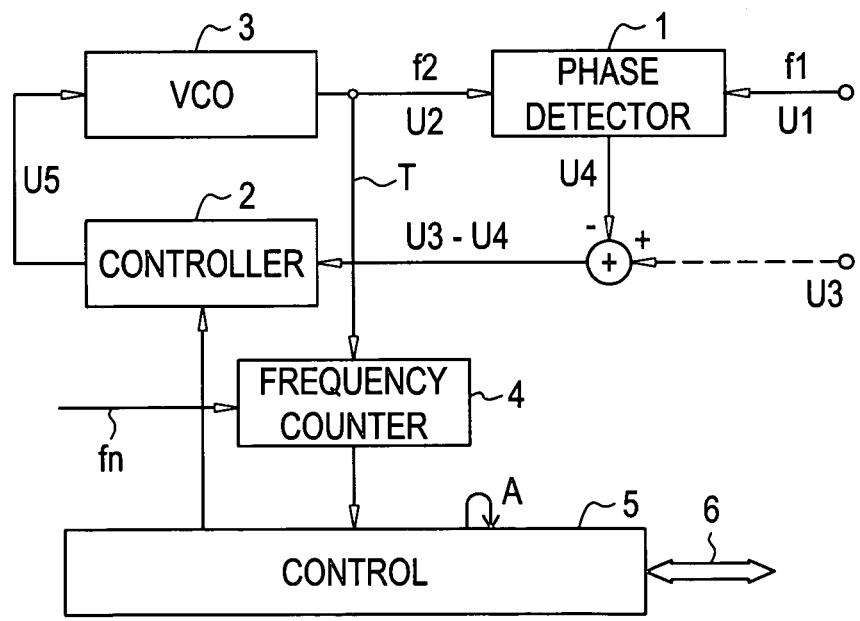
FIG. 7 shows a phase control circuit comprising a recognition circuit configured according to the invention for recognizing the locking-in of the phase control circuit.

This is shown by way of example using FIG. 7. Here, the known phase control circuit in FIG. 1 is assumed. Shown here at the output of the oscillator 3 is a frequency counter 4 that passes on the measured (counted) output frequency of the oscillator 3 to a control circuit 5. For this purpose, the frequency counter 4 needs an externally supplied standard frequency fn. The control circuit 5 reacts on the control circuit filter 2 in order to be able to impress an interference variable there. The control circuit 5 is furthermore connected via a bus 6 to the higher-level arrangement, in the example to the entire transmission unit. Furthermore, FIG. 7 shows that the recognition circuit is capable, by means of the control circuit 5, of delivering an alarm signal A, which is then, however, processed again in the example shown in the control circuit 5 itself.

The feedback to the control-circuit filter 2 takes place in the example by the digital value of an interference variable being added to the count of the counter 232 or being subtracted therefrom. The value of said interference variable must be dimensioned in such a way that a frequency change resulting therefrom in the case of a phase control circuit that is not locked in can be reliably detected by means of the frequency meter.

Another possibility for recognizing a change in the output frequency could be to correlate the impression of the interference variable temporally with other variables within the phase control circuit.

As soon as it is found in the present original example by means of the alarm signal A that the phase control circuit is not locked in, a procedure takes place that is comparable to the initialization. Said procedure is also performed by the control circuit 5. This is optionally supported externally via the bus 6 or delivers status signals thereto.

Here, the further digital to analog converter 25, which, although it has already been mentioned, has not been explained in greater detail in terms of its function, comes in useful. It is driven more or less statically by the control circuit 5. In interaction with the frequency counter 4, the entire circuit can be measured and tested here throughout. This can already be done still on the wafer during manufacture. Here, the characteristics of all three oscillators 34*a*, 34*b* and 34*c* can be measured. It is possible to test whether said oscillators 34*a*, 34*b* and 34*c* can, on the one hand, cover the entire required frequency range in totality or whether, on the other hand, they overlap sufficiently.

The characteristics of the three oscillators 34*a*, 34*b* and 34*c* may already be stored in this case in the control circuit 5. But even without storage, the adjustment necessary for the operation can, if necessary, be determined rapidly in this way (initiation or in the case of alarm). Consequently, a pre-adjustment can then take place also for the operation via the further digital to analog converter 25. A distribution of the effective capacitance of the frequency-determining parts of the respective oscillator can then thereby be achieved over a plurality of varicap diodes. This achieves the result that the individual varicap diodes only have to be varied in a narrow range so that it is possible to operate in the respective most linear range.

Further linearization can be achieved if, in each case, a plurality of varicap diodes are connected in parallel that are each operated in the center of the linear part of their characteristics.

Further linearization can be achieved if a separate digital to analog converter with correspondingly lower resolution is assigned to each of said varicap diodes since such converters become less linear with increasing resolution.

Figure 8:
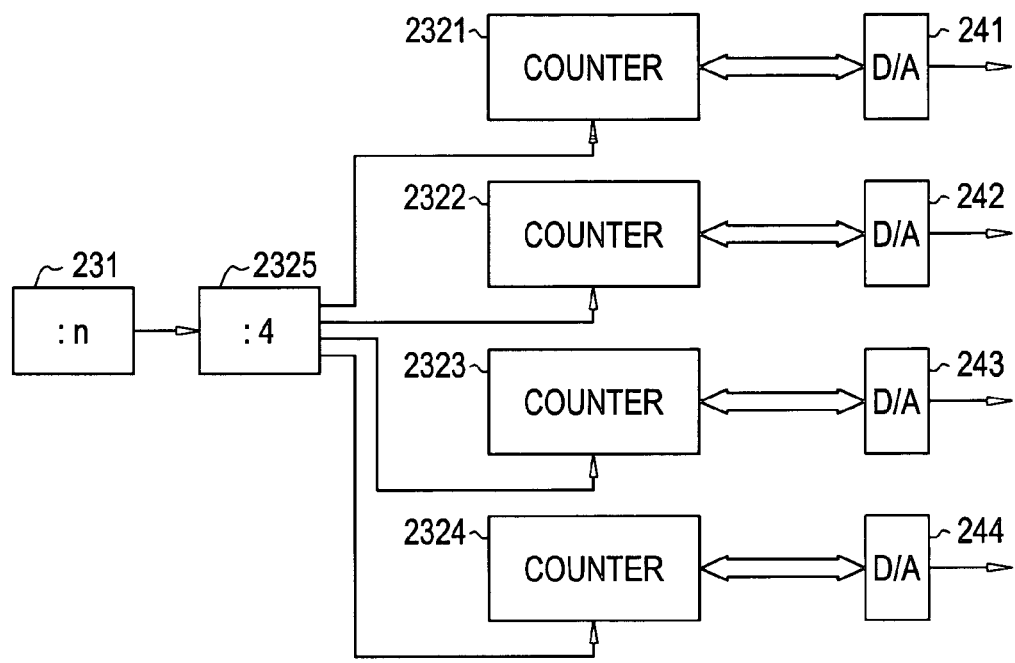
FIG. 8 shows a digital to analog converter constructed according to the invention.

An example is described using FIG. 8. In the latter, the second sub-counter 232 of the counter forming the low-pass filter 23 is divided up into a divider by four forming a first counter 2325 with connected decoder. Four alternately clocking individual signals are produced as output signals. A ten-stage counter 2321, 2322, 2323 or 2324, respectively, is now assigned to each of these individual signals. A digital analog converter 241, 242, 243 or 244, respectively, is now assigned to each of said counters 2321, 2322, 2323 and 2324. Instead of the counting clock pulses shown here, respective separate signals are actually required and also provided for decrementing and incrementing. In the case of continuously counting upwards, the individual digital to analog converters 241, 242, 243 and 244 are alternately raised by one step in each case.

Figure 9:
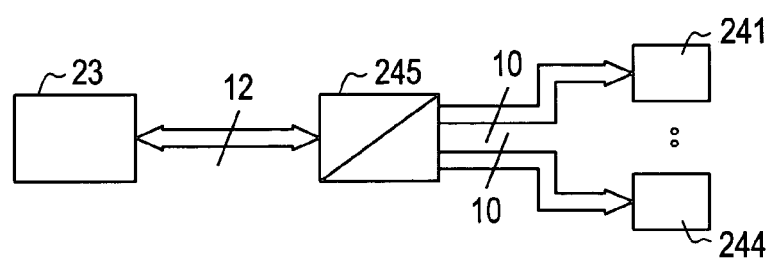
FIG. 9 shows a version, better implementable in practice, of a digital to analog converter according to the invention as in FIG. 8.

In terms of result, the same can, of course, also be achieved if, as FIG. 9 shows, a decoder 245 is used that converts, according to the functionality shown using FIG. 8, a twelve-bit number into four ten-bit numbers. This is in principle the functionality of a table that assigns four values each having ten bits to each of the twelve-bit value combinations.

The invention claimed is:

1. A digital to analog converter circuit, comprising:
   a plurality of digital to analog converters whose outputs form different but simultaneous portions of an output of said digital to analog converter circuit; and
   a distribution circuit for distributing digital input values of said digital to analog converter circuit to said plurality of D/A converters such that, in the case of a continuous incrementing or decrementing of said input values, the individual input values of the plurality of digital to analog converters are incremented or decremented in turn, said distribution circuit comprising a divide-by-n counter responsive to said input values of said converter circuit to provide n counter outputs, and n further counters each responsive to a respective one of said n counter outputs, an output from each of said n counters being coupled to a respective one of said plurality of D/A converters.

2. A digital to analog converter circuit, comprising:

a plurality of digital to analog converters whose outputs collectively form an output of said digital to analog converter circuit; and a distribution circuit for distributing digital input values of said digital to analog converter circuit to said plurality of D/A converters such that, in the case of a continuous incrementing of said input values by a given increment amount, the individual input values of the plurality of digital to analog converters are incremented in turn by said given increment amount, wherein said distribution circuit comprises a divide-by-n counter responsive to said input values of said converter circuit to provide n counter outputs, and n further counters each responsive to a respective one of said n counter outputs, an output from each of said n counters being coupled to a respective one of said plurality of D/A converters.

* * * * *